United States Patent
Yoo et al.

(10) Patent No.: US 11,581,187 B2
(45) Date of Patent: Feb. 14, 2023

(54) METHOD OF HEATING SOC FILM ON WAFER BY ELECTROMAGNETIC WAVE GENERATOR AND HEATING APPARATUS USING THE SAME

(71) Applicant: XIA TAI XIN SEMICONDUCTOR (QING DAO) LTD., Qingdao (CN)

(72) Inventors: Jiyong Yoo, Singapore (SG); Jong-Kill Lim, Singapore (SG); Sungkun Jang, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 365 days.

(21) Appl. No.: 16/667,802

(22) Filed: Oct. 29, 2019

(65) Prior Publication Data

US 2020/0203151 A1 Jun. 25, 2020

Related U.S. Application Data

(60) Provisional application No. 62/782,361, filed on Dec. 20, 2018.

(51) Int. Cl.
*H01L 21/027* (2006.01)
*H01L 21/67* (2006.01)

(52) U.S. Cl.
CPC .... *H01L 21/0273* (2013.01); *H01L 21/67115* (2013.01)

(58) Field of Classification Search
CPC ............. H01L 21/0273; H01L 21/0274; H01L 21/0275; H01L 21/0276; H01L 21/67011; H01L 21/67098; H01L 21/67115; H01L 21/6715; G03F 7/162; G03F 7/168; G03F 7/26; G03F 7/004; G03F 7/09; G03F 7/091
See application file for complete search history.

(56) References Cited

U.S. PATENT DOCUMENTS

| | | | |
|---|---|---|---|
| 7,935,940 B1 * | 5/2011 | Smargiassi | H01L 21/67248 250/492.1 |
| 2007/0224839 A1 * | 9/2007 | Shimizu | H05B 6/806 438/795 |
| 2013/0344703 A1 | 12/2013 | Shimizu et al. | |
| 2018/0359857 A1 | 12/2018 | Helleday | |

FOREIGN PATENT DOCUMENTS

| | | |
|---|---|---|
| CN | 103392387 A | 11/2013 |
| CN | 108781509 A | 11/2018 |

* cited by examiner

*Primary Examiner* — John P. Dulka
(74) *Attorney, Agent, or Firm* — ScienBiziP, P.C.

(57) ABSTRACT

The present disclosure provides a method of heating a spin on coating (SOC) film on a wafer. The method includes actions S401 to S405. In action S401, a heating apparatus is provided. The heating apparatus includes a bake plate and an electromagnetic wave generator. In action S402, the bake plate is heated by a heating unit disposed in the bake plate. In action S403, the wafer is placed on the bake plate of the heating apparatus. In action S404, the electromagnetic wave generator generates an electromagnetic wave to heat the SOC film. The electromagnetic wave generated by the electromagnetic wave generator has a frequency within a range of 1 THz to 100 THz. In action S405, the wafer is removed from the bake plate of the heating apparatus.

17 Claims, 7 Drawing Sheets

METHOD OF HEATING SOC FILM ON WAFER BY ELECTROMAGNETIC WAVE GENERATOR AND HEATING APPARATUS USING THE SAME

CROSS-REFERENCE TO RELATED APPLICATION

This application claims the benefit of U.S. Provisional Patent Application No. 62/782,361, filed on Dec. 20, 2018, the contents of which are incorporated by reference herein.

FIELD

The present disclosure generally relates to a method of heating a spin on coating (SOC) film on a wafer and a heating apparatus using the same. More specifically, the present disclosure relates to a method of heating a SOC film by using electromagnetic waves.

BACKGROUND

Integrated circuits are generally made by photolithographic processes that use reticles (or photomasks) and an associated light source to project a circuit image on the surface of a semiconductor wafer. The photolithography process entails coating the wafer with a layer of photoresist, exposing the layer of photoresist and then developing the exposed photoresist. The coating of photoresist layer involves spin-coating a photoresist solution containing light sensitive materials onto a surface of the wafer. After the spin-coating, the photoresist layer is heated to evaporate solvent in the photoresist solution, and the photoresist layer is dried for subsequent exposure processes. A bottom anti-reflective coating (BARC) layer maybe provided between the photoresist layer and the wafer to prevent diffuse reflection. The BARC layer is also formed by a spin-coating process.

After spin-coating the BARC layer on the wafer, the BARC layer is heated to be dried. Then, the photoresist layer is formed on the dried BARC layer by spin-coating and heating. Usually, the BARC layer may be heated to a temperature within a range of 300° C. to 400° C., and the photoresist layer may be heated to a temperature within a range of 100° C. to 350° C.

Referring to FIGS. 1A to 1B, schematic diagrams showing a process of heating a BARC layer on a wafer are illustrated. As shown in FIG. 1A, a wafer 110 coated with a BARC layer 111 is placed on a bake plate 120 that has a heating target temperature (which may be as high as 350° C.). The wafer 110 is heated by the bake plate 120 to dry the BARC layer 111. After the BARC layer 111 is dried, the wafer 110 needs to be cooled to a room temperature for subsequent processes, as shown in FIG. 1B. Usually, temperature of the wafer 110 equals to room temperature after a spin-coating process. The wafer 110 may crack when placed on the bake plate 120 having a temperature as high as 350° C. In order to prevent wafer cracking, the wafer 110 may be heated by a two-action heating process as shown in FIG. 1C. In the two-action heating process, the wafer 110 is heated on a bake plate having a temperature below the heating target temperature, for example, 200° C. Then, the wafer 110 is heated on another bake plate having the heating target temperature of 350° C. When cooling the wafer 110, a two-action cooling process may also be applied (i.e., the wafer 110 is cooled on a cooling plate having a temperature of 200° C., and then cooled to the room temperature).

Similar processes may be adopted for heating a photoresist layer on the wafer 110. However, such heating process is energy consuming. Also, wafer cracking or other defects are likely to occur when the wafer 110 undergoes such a large temperature variation process.

Accordingly, there is a need to improve photoresist layer and BARC layer heating process for wafers.

SUMMARY

The present disclosure is directed to providing a method and a heating apparatus to improve photoresist layer and bottom anti-reflective coating (BARC) layer heating process for a wafer.

An implementation of the present disclosure provides a method of heating a spin on coating (SOC) film on a wafer. The SOC film includes a photoresist layer or a bottom anti-reflective coating (BARC) layer. The method includes actions S401 to S405. In action S401, a heating apparatus is provided. The heating apparatus includes a bake plate and an electromagnetic wave generator. In action S402, the bake plate is heated by a heating unit disposed in the bake plate. The bake plate is heated to a temperature within a range of 80° C. to 150° C. In action S403, the wafer is placed on the bake plate of the heating apparatus. In action S404, the electromagnetic wave generator generates an electromagnetic wave to heat the SOC film. The electromagnetic wave generated by the electromagnetic wave generator has a frequency within a range of 1 THz to 100 THz. In action S405, the wafer is removed from the bake plate of the heating apparatus.

Another implementation of the present disclosure provides a heating apparatus for a wafer having a spin on coating (SOC) film. The SOC film includes a photoresist layer or a bottom anti-reflective coating (BARC) layer. The heating apparatus includes a processing chamber, a bake plate, and an electromagnetic wave generator. The processing chamber is configured to accommodate the wafer. The bake plate is disposed in the processing chamber for holding and heating the wafer. The electromagnetic wave generator is disposed in the processing chamber and configured to generate an electromagnetic wave to heat the SOC film of the wafer. The electromagnetic wave has a frequency within a range of 1 THz to 100 THz.

As described above, the method and the heating apparatus of the implementations of the present disclosure use an electromagnetic wave generator incorporated with a bake plate to heat a SOC film on a wafer. The SOC film can be heated to a target temperature by electromagnetic waves generated by the electromagnetic wave generator, while the wafer can be maintained at a temperature lower than the target temperature. Therefore, the method and the heating apparatus of the implementations of the present disclosure can heat the SOC film on the wafer in an efficient way, and prevent wafer cracking or other defects caused by high temperature processes.

BRIEF DESCRIPTION OF THE DRAWINGS

Implementations of the present technology will now be described, by way of example only, with reference to the attached figures.

DETAILED DESCRIPTION

Figure 1A:
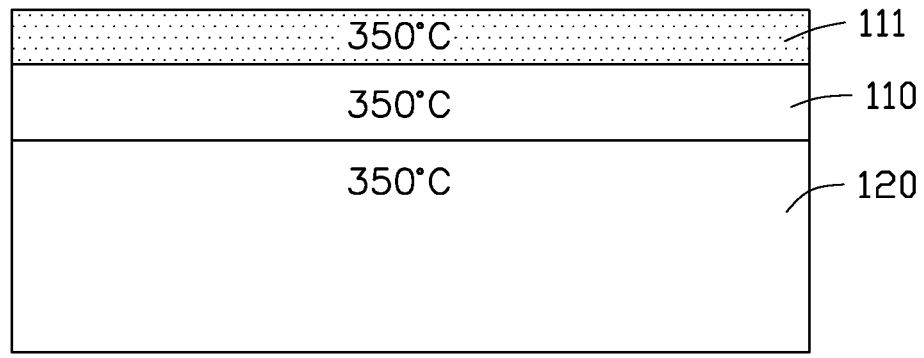
FIGS. 1A to 1C are schematic diagrams showing a heating process for a bottom anti-reflective coating (BARC) layer on a wafer according to the prior art.
Figure 1B:
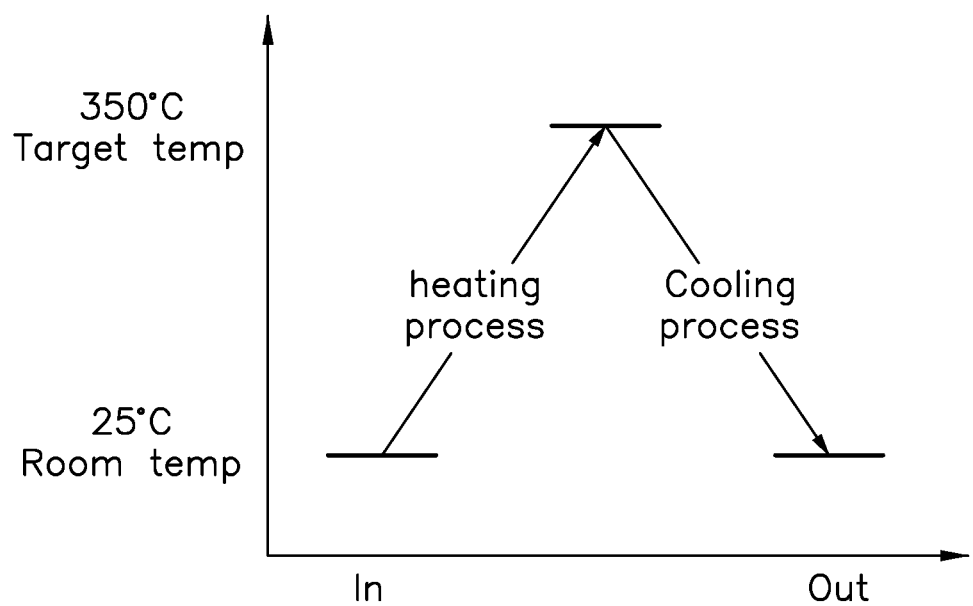
Figure 1C:
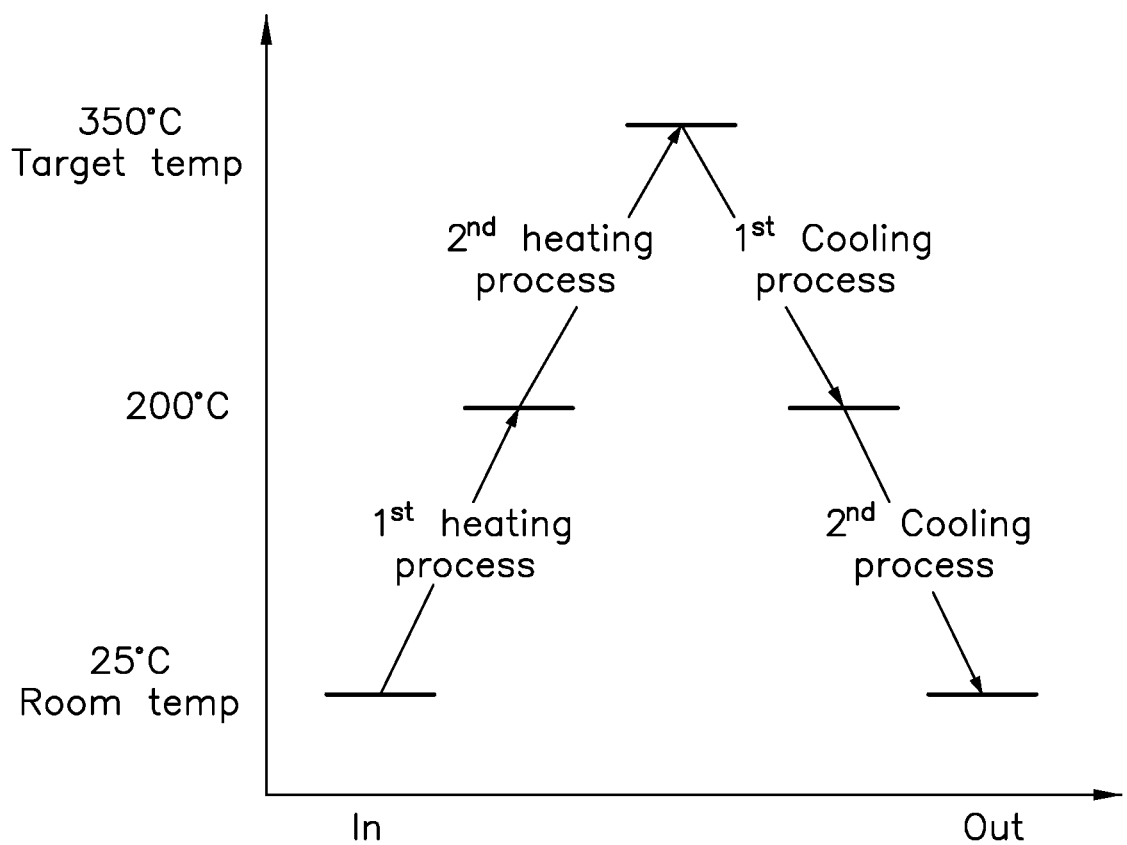

The present disclosure will now be described more fully hereinafter with reference to the accompanying drawings, in which example implementations of the disclosure are shown. This disclosure may, however, be embodied in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 2A to 4. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 2A:
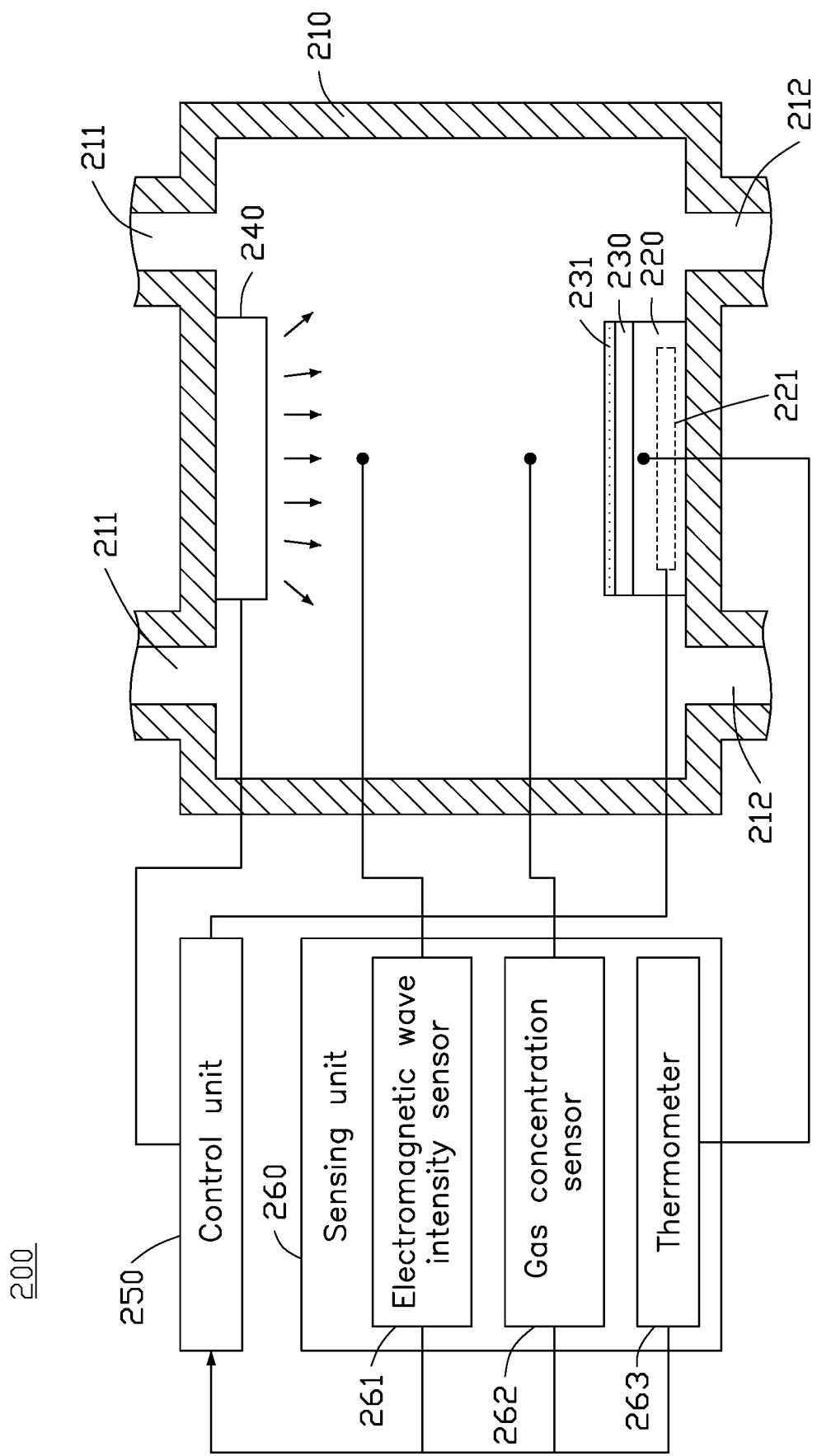
FIG. 2A is a schematic diagram of a heating apparatus for a wafer according to an implementation of the present disclosure.

Referring to FIG. 2A, a schematic diagram of a heating apparatus 200 for a wafer according to an implementation of the present disclosure is illustrated. As shown in FIG. 2A, the heating apparatus 200 is configured to heat a wafer 230 having a spin on coating (SOC) film 231 coated on its top surface. The SOC film 231 is formed on the top surface of the wafer 230 by spin coating processes. The SOC film 231 may include a photoresist layer or a bottom anti-reflective coating (BARC) layer. The BARC layer is provided between the photoresist layer and the wafer 230. The BARC layer of the SOC film 231 is formed by spin coating a solution containing at least one light absorbing material onto the wafer 230. After spin coating, the BARC layer of the SOC film 231 is heated by the heating apparatus 200 to dry. The photoresist layer of the SOC film 231 is formed by spin coating a solution containing at least one light sensitive material onto the dried BARC layer. After spin coating, the photoresist layer of the SOC film 231 is also heated by the heating apparatus 200 to dry. The BARC layer is configured to absorb radiation used during an exposure process of the photoresist layer, to prevent diffuse reflection and the like so that the exposed and developed light sensitive material in the photoresist layer can have a cross section perpendicular to the wafer 230, and to be insoluble in the solvent contained in the photoresist layer. The photoresist layer or the BARC layer includes a solvent for dissolving the light sensitive material or the light absorbing material. Examples of the solvent of the photoresist layer or the BARC layer may include, but are not limited to, mono-alcohols (such as methanol, ethanol, and propanol), polyols (such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerol), glycol ethers (such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether), cyclic ethers (such as 1,3-dioxane and 1,4-dioxane), glycol esters (such as ethylene glycol acetate), ketones (such as acetone, methyl ethyl ketone, and methyl isobutyl ketone), and aromatic hydrocarbons (such as toluene and xylene). These solvents can be used alone or in combination. The light sensitive material of the photoresist layer may include at least one material selected from novolac resin, allyl-novolac resin, fluoro-novolac resin, and crosslinked-novolac resin. In other words, the photoresist layer includes the solvent and at least one material selected from a group consisting of novolac resin, allyl-novolac resin, fluoro-novolac resin, and crosslinked-novolac resin. The heating apparatus 200 includes a processing chamber 210, a bake plate 220, and an electromagnetic wave generator 240. The processing chamber 210 is configured to accommodate the wafer 230. The bake plate 220 is disposed in the processing chamber 210 for holding the wafer 230. The bake plate 220 includes a heating unit 221 for heating the bake plate 220. The electromagnetic wave generator 240 is disposed in the processing chamber 210 and configured to generate an electromagnetic wave to heat the SOC film 231 of the wafer 230.

The heating apparatus 200 may further include a control unit 250 and a sensing unit 260. The control unit 250 is coupled to the electromagnetic wave generator 240 and configured to control an operation of the electromagnetic wave generator 240. The control unit 250 may also be coupled to the heating unit 221 of the bake plate 220 and configured to control an operation of the heating unit 221. The sensing unit 260 is coupled to the control unit 250 and configured to monitor the operation of the heating apparatus 200. The sensing unit 260 may include a thermometer 263 configured to detect a temperature of the bake plate 220, a gas concentration sensor 262 configured to detect a gas concentration in the processing chamber 210, and an electromagnetic wave intensity sensor 261 configured to detect an electromagnetic wave intensity in the processing chamber 210. The processing chamber 210 includes at least one gas inlet 211 and at least one exhaust port 212. The at least one gas inlet 211 is configured to introduce an inert gas (such as nitrogen) into the processing chamber 210. The at least on exhaust port 212 is configured to exhaust gas (such as evaporated solvent from the SOC film 231) from the processing chamber 210. The heating unit 221 of the bake plate 220 may include heating wires spirally distributed in the bake plate 220.

Figure 2B:
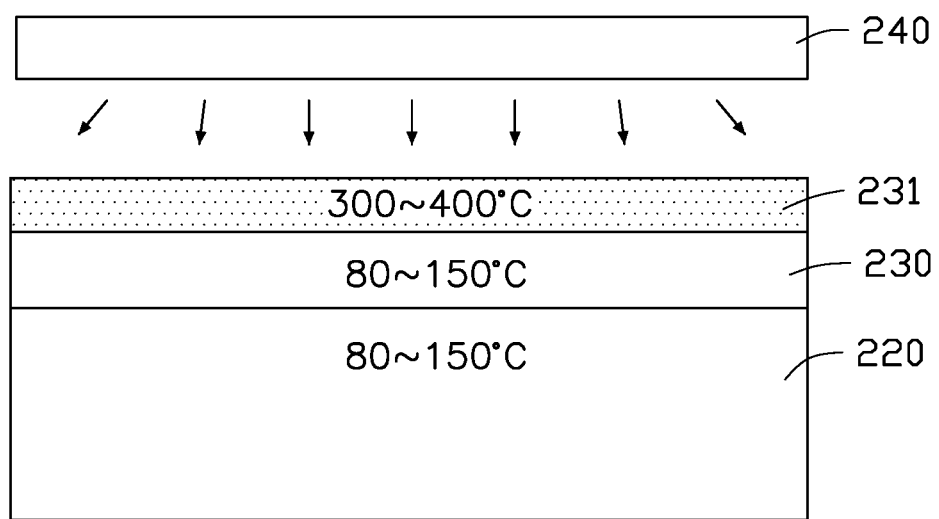
FIG. 2B is a diagram showing a temperature distribution in the heating apparatus of FIG. 2A.

When the wafer 230 is placed on the bake plate 220 in the processing chamber, the bake plate 220 heats the wafer 230 by the heating unit 221 through direct contact or in a contact manner. Meanwhile, the electromagnetic wave generator 240 generates an electromagnetic wave to heat the SOC film 231 on the wafer 230 remotely or in a non-contact manner. The electromagnetic wave is configured to heat the SOC film 231 to a temperature higher than a temperature of the bake plate 220. By using the electromagnetic wave, the bake plate 220 can be operated at a temperature that is lower than a target temperature required to dry the SOC film 231. As shown in FIG. 2B, for example, the BARC layer of the SOC film 231 must be heated to a target temperature within a range of 300° C. to 400° C. for proper drying. By using the electromagnetic wave generator 240, the bake plate 220 can be operated at a temperature within a range of 80° C. to 150° C. In other words, the heating unit 221 of the bake plate 220 is configured to heat the bake plate 220 to a temperature within a range of 80° C. to 150° C., which is much lower than the target temperature of 300° C. to 400° C. Also, the temperature of the wafer 230 can be maintained at a temperature within the range of 80° C. to 150° C. For the photoresist layer, the target temperature for heating the photoresist layer is dependent on the light sensitive materials, generally within a range of 100° C. to 350° C. For example, the target temperature for heating the novolac resin may be within a range of 110° C. to 130° C., and the bake plate 220 may be operated at a temperature within a range of 80° C. to 100° C. to heat the wafer 230 to a temperature within a range of 80° C. to 100° C. Therefore, the temperature of the wafer can be reduced during the heating process of the SOC film 231 to prevent wafer cracking or other defects.

Figure 3A:
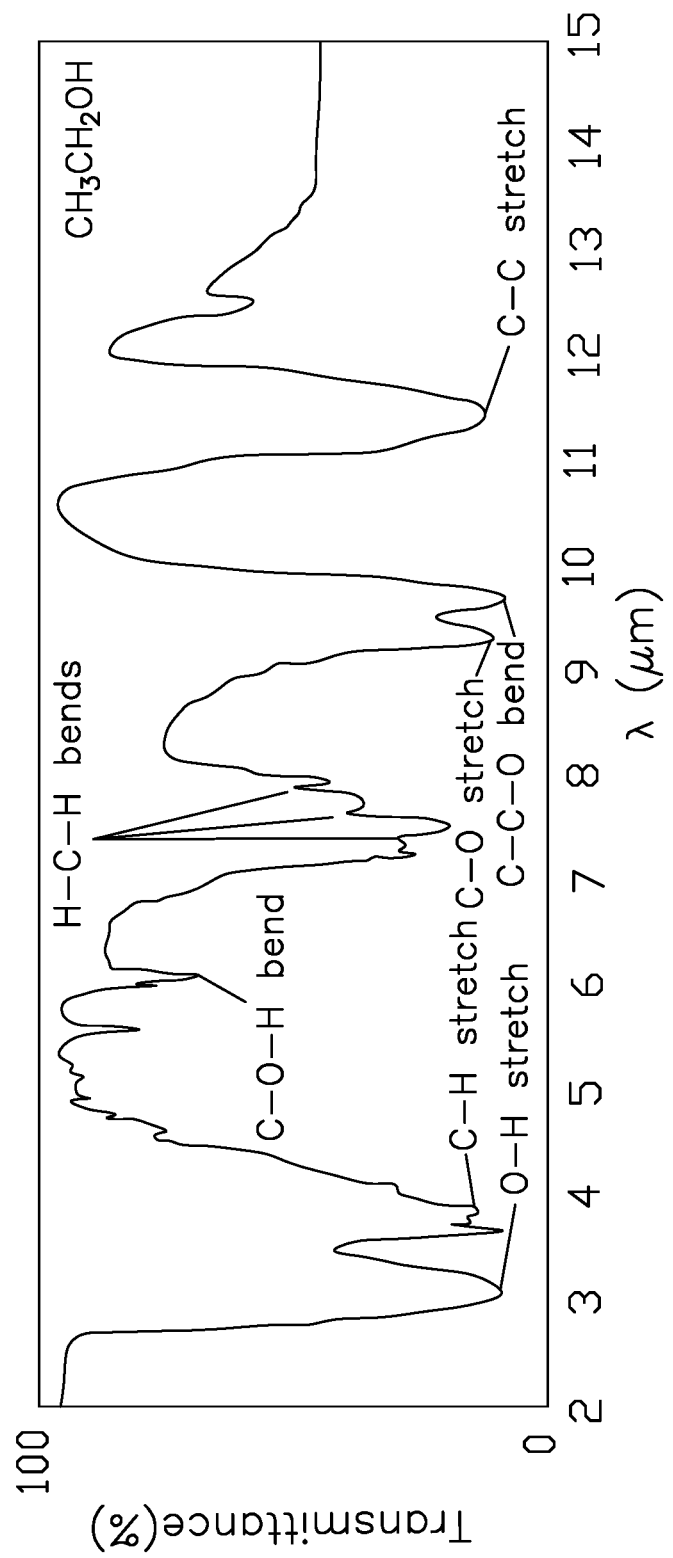
FIG. 3A is a diagram of a transmittance spectrum of a solvent in a photoresist layer.

Referring to FIG. 3A, a transmittance spectrum of a solvent (e.g., ethanol) for the SOC film 231 is illustrated. As shown in FIG. 3A, ethanol absorbs light having a wavelength within a range of 3 μm to 15 μm. According to an equation $f=C \div \lambda$ (where C is light speed, f is frequency, and λ is wavelength), the ethanol absorbs light having a frequency within a range of 20 THz to 100 THz. For example, the light transmittance is lowest (but highest in light absorption) at the wavelength of 9.7 μm when the frequency of light is 30 THz.

Figure 3B:
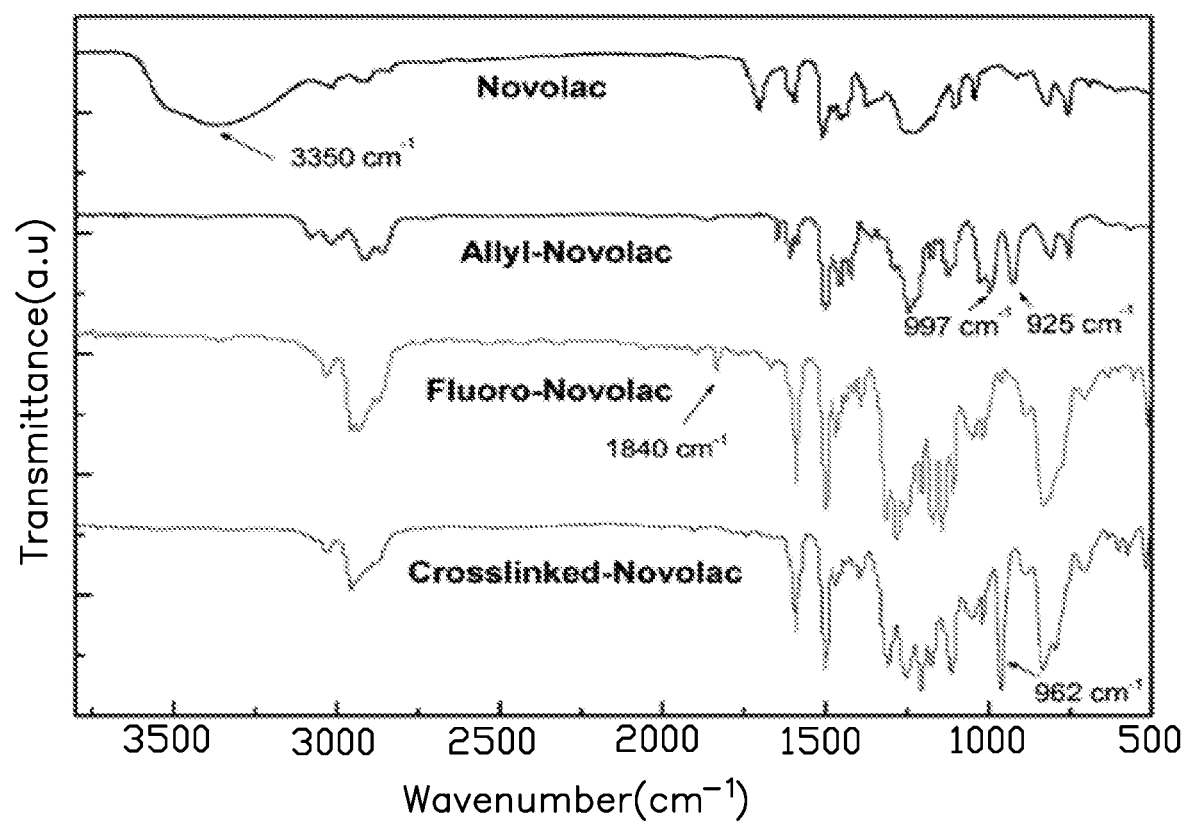
FIG. 3B is a diagram of a transmittance spectrum of light sensitive materials in the photoresist layer.

Referring to FIG. 3B, transmittance spectra of light sensitive materials (e.g., novolac resin, allyl-novolac resin, fluoro-novolac resin, and crosslinked-novolac resin) for the photoresist layer are illustrated. As shown in FIG. 3B, the light sensitive materials absorb light having a wavenumber within a range of 1800 $cm^{-1}$ to 500 $cm^{-1}$.

According to an equation $f=C \times N$ (where C is light speed, f is frequency, and N is wavenumber), the light sensitive materials absorb an electromagnetic wave having a frequency within a range of 15 THz to 54 THz. For example, the transmittance for crosslinked-novolac is lowest (but highest in light absorption) at the wavenumber of 962 $cm^{-1}$ when the frequency of light is 29 THz.

Therefore, the electromagnetic wave generated by the electromagnetic wave generator 240 has a frequency within a range of 1 THz to 100 THz, preferably 10 THz to 100 THz. The SOC film 231 absorb radiation energy from the electromagnetic wave, causing the temperature of the SOC film 231 to increase to the target temperature (such as 300° C. to 400° C. for the BARC layer of the SOC film 231) to achieve drying of the SOC film 231. Since the wafer 230 does not absorb radiation energy from the electromagnetic wave, the wafer remains at a low temperature within the range of 80° C. to 150° C. Therefore, the heating apparatus 200 of the implementations of the present disclosure can heat the SOC film 231 on the wafer 230 in an efficient way, and prevent wafer cracking or other defects caused by high temperature processes.

Figure 4:
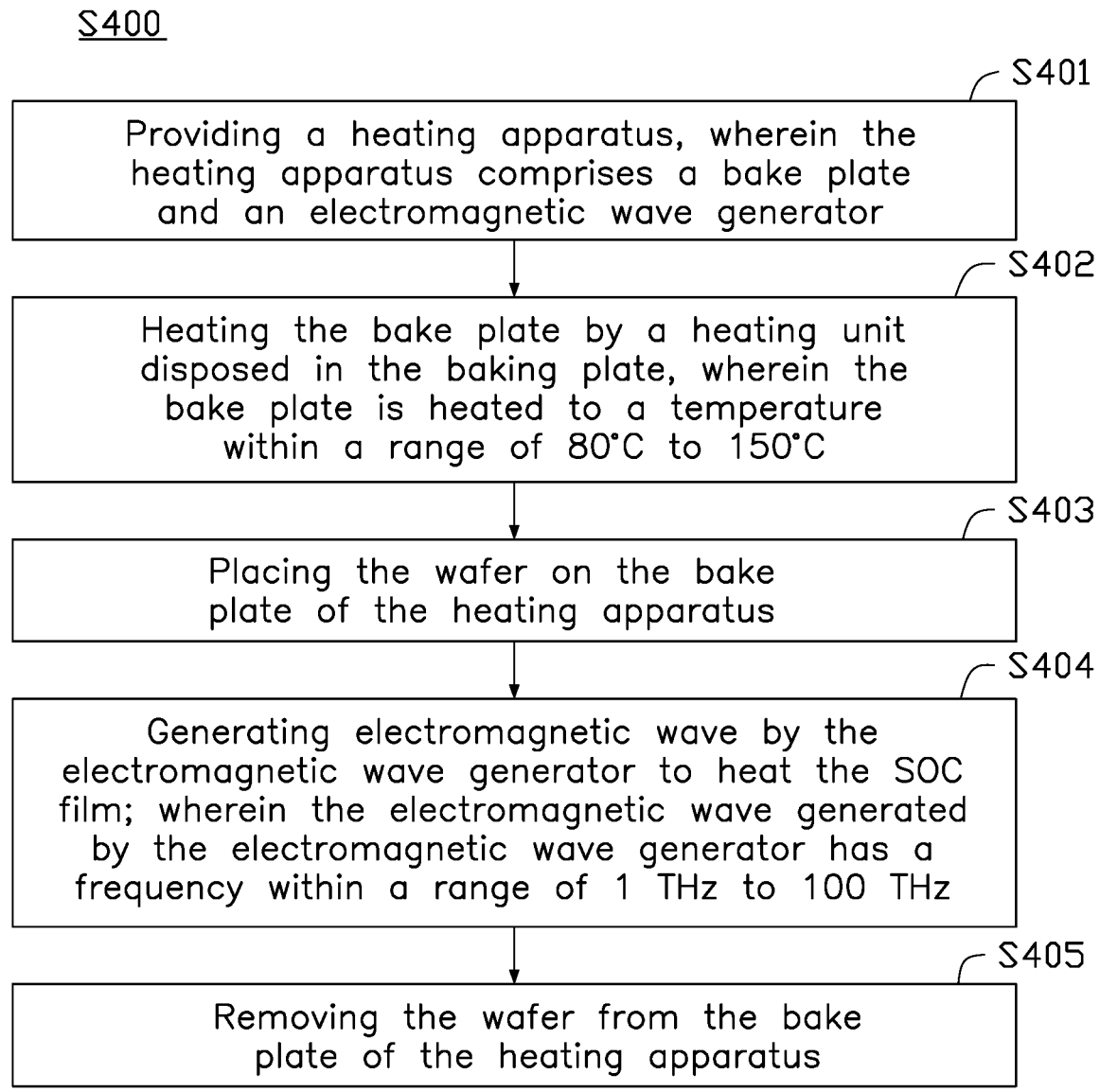
FIG. 4 is a flowchart of a method of heating a spin on coating film on a wafer according to another implementation of the present disclosure.

Referring to FIG. 4, a flowchart of a method S400 of heating a spin on coating (SOC) film on a wafer according to another implementation of the present disclosure is illustrated. As show in FIG. 4, the method S400 includes actions S401 to S405. In action S401, a heating apparatus is provided. The heating apparatus can be referred to the heating apparatus 200 of FIGS. 2A and 2B. The heating apparatus 200 is configured to heat a wafer 230 having a SOC film 231 coated on its top surface. The SOC film 231 includes a photoresist layer or a bottom anti-reflective coating (BARC) layer. The photoresist layer of the SOC film 231 includes at least one material selected from a group consisting of novolac resin, allyl-novolac resin, fluoro-novolac resin, and crosslinked-novolac resin. The heating apparatus 200 includes a processing chamber 210, a bake plate 220, and an electromagnetic wave generator 240. The processing chamber 210 is configured to accommodate the wafer 230. The bake plate 220 is disposed in the processing chamber 210 for holding the wafer 230. The bake plate 220 includes a heating unit 221 for heating the bake plate 220. The electromagnetic wave generator 240 is disposed in the processing chamber 210 and configured to generate an electromagnetic wave to heat the SOC film 231 of the wafer 230. The heating apparatus 200 may further include a control unit 250 and a sensing unit 260. The control unit 250 is coupled to the electromagnetic wave generator 240 and configured to control an operation of the electromagnetic wave generator 240. The control unit 250 is also coupled to the heating unit 221 of the bake plate 220 and configured to control an operation of the heating unit 221. The sensing unit 260 is coupled to the control unit 250 and configured to monitor the operation of the heating apparatus 200. The sensing unit 260 may include a thermometer 263 configured to detect a temperature of the bake plate 220, a gas concentration sensor 262 configured to detect a gas concentration in the processing chamber 210, and an electromagnetic wave intensity sensor 261 configured to detect an electromagnetic wave intensity in the processing chamber 210. The processing chamber 210 includes at least one gas inlet 211 and at least one exhaust port 212. The at least one gas inlet 211 is configured to introduce an inert gas (such as nitrogen) into the processing chamber 210. The at least on exhaust port 212 is configured to exhaust gas (such as evaporated solvent from the SOC film 231) from the processing chamber 210. The heating unit 221 of the bake plate 220 may include heating wires spirally distributed in the bake plate 220.

In action S402, the bake plate 220 of the heating apparatus 200 is heated by the heating unit 221 disposed in the bake plate 220. The bake plate 220 is heated to a temperature within a range of 80° C. to 150° C. In action S403, the wafer 230 is placed on the bake plate 220 of the heating apparatus 200. In action S404, the electromagnetic wave generator 240 generates an electromagnetic wave to heat the SOC film 231 on the wafer. The electromagnetic wave generated by the electromagnetic wave generator has a frequency within a range of 1 THz to 100 THz, preferably 10 THz to 100 THz. The SOC film 231 is heated by the electromagnetic wave to a temperature higher than the temperature of the bake plate 220 (i.e., 80° C. to 150° C.).

As shown in FIG. 2B, for example, the BARC layer of the SOC film 231 is heated to a target temperature within a range of 300° C. to 400° C. to be dried. By using the electromagnetic wave generator 240, the bake plate 220 can be operated at the temperature within the range of 80° C. to 150° C. In other words, the heating unit 221 of the bake plate 220 is configured to heat the bake plate to the temperature within the range of 80° C. to 150° C., which is much lower than the target temperature of 300° C. to 400° C. Meanwhile, the temperature of the wafer 230 can be maintained at a temperature within the range of 80° C. to 150° C. The BARC layer of the SOC film 231 absorbs radiation energy from the electromagnetic wave, causing the temperature of the BARC layer of the SOC film 231 to increase to the target temperature (such as 300° C. to 400° C.) to achieve drying of the BARC layer of the SOC film 231. Since the wafer 230 does not absorb radiation energy from the electromagnetic wave, the wafer remains at a low temperature within the range of 80° C. to 150° C. For the photoresist layer of the SOC film 231, the target temperature for heating the photoresist layer is dependent on the light sensitive materials, generally within a range of 100° C. to 350° C. For example, the target temperature for heating the novolac resin may be within a range of 110° C. to 130° C., and the bake plate 220 may be operated at a temperature within a range of 80° C. to 100° C. to heat the wafer 230 to a temperature within a range of 80° C. to 100° C. Therefore, the heating method S400 of the implementations of the present disclosure can heat the SOC film 231 on the wafer 230 in an efficient way, and prevent wafer cracking or other defects caused by high temperature processes.

In action S405, after the SOC film 231 is heated and dried, the wafer 230 is removed from the bake plate 220 of the heating apparatus 200.

As described above, the method and the heating apparatus of the implementations of the present disclosure uses an electromagnetic wave generator incorporated with a bake plate to heat a SOC film on a wafer. The SOC film can be heated to a target temperature by electromagnetic waves generated by the electromagnetic wave generator, while the wafer can be maintained at a temperature lower than the target temperature. Therefore, the method and the heating apparatus of the implementations of the present disclosure can heat the SOC film on the wafer in an efficient way, and prevent wafer cracking or other defects caused by high temperature processes.

The implementations shown and described above are only examples. Many details are often found in the art such as the other features of a method of heating a SOC film on a wafer and a heating apparatus using the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A method of heating a spin on coating (SOC) film on a wafer, comprising:
   providing a heating apparatus, wherein the heating apparatus comprises a bake plate and an electromagnetic wave generator;
   heating the bake plate by a heating unit disposed in the bake plate before the wafer is placed on the bake plate;
   placing the wafer on the bake plate of the heating apparatus; and
   generating an electromagnetic wave by the electromagnetic wave generator to heat the SOC film, wherein the electromagnetic wave generated by the electromagnetic wave generator has a frequency within a range of 1 THz to 100 THz.

2. The method of claim 1, wherein the bake plate is heated to a temperature within a range of 80° C. to 150° C., and the SOC film is heated by the electromagnetic wave to a temperature higher than the temperature of the bake plate.

3. The method of claim 1, wherein the SOC film comprises a photoresist layer or a bottom anti-reflective (BARC) layer.

4. The method of claim 1, wherein the frequency of the electromagnetic wave is within a range of 10 THz to 100 THz.

5. The method of claim 1, further comprising:
   removing the wafer from the bake plate of the heating apparatus after the SOC film is heated.

6. A heating apparatus for a wafer having a spin on coating (SOC) film, comprising:
   a processing chamber for accommodating the wafer;
   a bake plate disposed in the processing chamber for holding and heating the wafer;
   a heating unit for heating the bake plate; and
   an electromagnetic wave generator disposed in the processing chamber and configured to generate an electromagnetic wave to heat the SOC film of the wafer, wherein the electromagnetic wave has a frequency within a range of 1 THz to 100 THz;
   wherein the heating unit is configured to heat the bake plate to a temperature within a range of 80° C. to 150° C., and the electromagnetic wave is configured to heat the SOC film to a temperature higher than the temperature of the bake plate.

7. The heating apparatus of claim 6, wherein the SOC film comprises a photoresist layer or a bottom anti-reflective (BARC) layer.

8. The heating apparatus of claim 6, wherein the frequency of the electromagnetic wave is within the range of 10 THz to 100 THz.

9. The heating apparatus of claim 6, wherein the heating unit comprises heating wires.

10. The heating apparatus of claim 6, further comprising a control unit coupled to the electromagnetic wave generator and configured to control an operation of the electromagnetic wave generator.

11. The heating apparatus of claim 10, wherein the bake plate comprises a heating unit for heating the bake plate, the control unit is coupled to the heating unit of the bake plate and configured to control an operation of the heating unit.

12. The heating apparatus of claim 10, further comprising a sensing unit coupled to the control unit and configured to monitor an operation of the heating apparatus.

13. The heating apparatus of claim 12, wherein the sensing unit comprises a thermometer configured to detect a temperature of the bake plate.

14. The heating apparatus of claim 12, wherein the sensing unit comprises a gas concentration sensor configured to detect a gas concentration in the processing chamber.

15. The heating apparatus of claim 12, wherein the sensing unit comprises an electromagnetic wave intensity sensor configured to detect an electromagnetic wave intensity in the processing chamber.

16. The heating apparatus of claim 6, wherein the processing chamber comprises at least one gas inlet configured to introduce an inert gas into the processing chamber.

17. The heating apparatus of claim 6, wherein the processing chamber comprises at least one exhaust port configured to exhaust gas from the processing chamber.

* * * * *